United States Patent [19]
Thompson et al.

[11] Patent Number: 5,196,368
[45] Date of Patent: Mar. 23, 1993

[54] SEMICONDUCTOR DEVICE MANUFACTURE

[75] Inventors: George H. B. Thompson; Piers J. G. Dawe, both of Sawbridgeworth Herts; David A. H. Spear, Essex, all of United Kingdom

[73] Assignee: Northern Telecom Limited, Montreal, Canada

[21] Appl. No.: 697,096

[22] Filed: May 8, 1991

[30] Foreign Application Priority Data
May 19, 1990 [GB] United Kingdom ............... 9011249

[51] Int. Cl.⁵ ............................................. H01C 21/20
[52] U.S. Cl. ..................................... 437/90; 437/67; 437/228; 156/644; 156/649; 148/DIG. 50; 148/DIG. 106
[58] Field of Search ............ 437/90, 228, 91, 67; 156/644, 649, 653, 657; 148/DIG. 50, DIG. 106

[56] References Cited

U.S. PATENT DOCUMENTS

| | | |
|---|---|---|
| 4,609,413 | 9/1986 | Boland .................................. 437/90 |
| 4,757,033 | 7/1988 | Ebata .................................. 156/644 |
| 4,784,970 | 11/1988 | Solomon . |
| 4,824,795 | 4/1989 | Blanchard .............................. 437/90 |
| 5,094,972 | 3/1992 | Pierce et al. ........................ 437/228 |

*Primary Examiner*—Brian E. Hearn
*Assistant Examiner*—Kevin Picardat
*Attorney, Agent, or Firm*—Lee, Mann, Smith, McWilliams, Sweeney & Ohlson

[57] ABSTRACT

A technique for achieving a substantially planar structure incorporating embedded vapor phase epitaxial growth involves the use of a window-frame shaped mask 40 of epitaxial growth resistant material to define a well in which embedded growth is to occur, and subsequently to ease mask registration problems in the location of a mask 60 employed while selectively removing unwanted material epitaxially grown on regions surrounding the well. Complementary format structures may also be formed in which epitaxial growth is provided up the sides of a mesa to substantially the same height as material grown on top of the mesa itself.

10 Claims, 5 Drawing Sheets

SEMICONDUCTOR DEVICE MANUFACTURE

BACKGROUND OF THE INVENTION

This invention relates to semiconductor device manufacture and in particular to the construction of devices in which one or more epitaxially grown layers are required to be present in an in-filled well formed in one surface of a semiconductive body, but not on the surface surrounding that well, or of the complementary structure in which the layers are required to surround a mesa but not to be present on top of it. Such structures are desirable for instance in the use of certain forms of circuit device that incorporate both all-electronic and electro-optic elements on a common substrate chip, such as optical receiver chips that include a photodetector and a front-end amplifier. In the manufacture of such devices it is generally advantageous if the growth can be arranged so as to produce a substantially planar surface at the end of the growth of semiconductor material. For one reason, this enables the use of high quality (contact) photolithography.

One approach to providing structures of this kind is described in United Kingdom Patent Specification No. GB 2 222 720, to which attention is directed. That specification describes a method of manufacture in which a well is etched prior to the growth of first and second sets of epitaxial layers, the first set in which FET's may subsequently be constructed and the second set for the construction of a photodiode. Then the well area is masked while the second set of layers is removed from the area surrounding the well. By making the depth of the well approximately equal to the aggregate thickness of the second set of layers, the height of material surrounding the well is reduced to a level substantially flush with the top of the material under the mask in the well. There is however a problem of registration between the mask and the well. Clearly a substantially flush top surface would not result if the mask were allowed to overlap the side wall of the well at any point in its perimeter, and so the mask is made deliberately smaller than the well in order to leave an adequate safety-margin for alignment errors. This safety-margin results in the formation of a trench between the side walls of the well and the masked area within the trench. For some applications the presence of such a trench presents no particular problem, but for others its presence would be a distinct drawback.

SUMMARY OF THE INVENTION

A particular problem addressed by the present invention is the problem of mask registration to ensure that, when the material epitaxially grown in the etched well is remasked preparatory for selective removal of at least some of the corresponding material epitaxially grown on the surfaces surrounding the well, on the one hand this remasking shall not accidentally overlap any of this corresponding material, while on the other hand it shall not expose any of the material epitaxially grown within the well. A primary reason for not wanting to expose any of the material epitaxially grown within the well is that the selective removal of the material surrounding the well would, in the presence of such exposure, result in the formation of an undesirable trench between the side walls of the well and the sides of the epitaxially grown material within the well.

According to the present invention there is provided a method of semiconductor device manufacture, which method includes the use of a window-frame shaped epitaxial growth resistant mask having an inner perimeter and an outer perimeter, which mask is located on one surface of a semiconductor body, wherein masking that is used to delineate the side walls of a well formed in said semiconductor body is also used to delineate the inner perimeter of the frame-shaped mask, wherein, using said mask, a layer is epitaxially grown upon the semiconductor body both in the region surrounded by the inner perimeter of the mask and in the region surrounding the outer perimeter, and wherein further masking is provided to cover the epitaxially grown layer in the region surrounded by the inner perimeter of the mask while, in the region surrounding the outer perimeter, at least a portion of the thickness of the layer is removed by etching.

The invention also provides a method of semiconductor device manufacture, which method includes the use of a window-frame shaped epitaxial growth resistant mask having an inner perimeter and an outer perimeter, which mask is located on one surface of a semiconductor body, wherein masking that is used to delineate the side walls of a mesa formed in said semiconductor body is also used to delineate the outer perimeter of the frame-shaped mask, wherein, using said mask, a layer is epitaxially grown upon the semiconductor body both in the region surrounded by the inner perimeter of the mask and in the region surrounding the outer perimeter, and wherein further masking is provided to cover the epitaxially grown layer in the region surrounding the outer perimeter of the mask while, in the region surrounded by the inner perimeter, at least a portion of the thickness of the layer is removed by etching.

In the case of the in-filled well structure, the use of the epitaxially growth resistant window-frame shaped mask relaxes the registration problem by providing a growth-free zone immediately surrounding the well that allows the remasking to be large enough to ensure complete coverage of the well by ensuring that the remasking extends over the inner perimeter of the window-frame mask while ensuring that it does not extend beyond the outer perimeter. Additionally it will be observed that the well is formed in a way providing self-alignment between the area enclosed by the window-frame and the area of the well. Similar considerations apply mutatis mutandis in respect of the complementary format structure referred to in the preceding paragraph that has a mesa in place of the well.

- Another feature of the use of the window-frame is that its width need only be as large as is necessary to provide a satisfactory solution to the mask registration problem, and hence its surface area can be small in comparison with the area over which the epitaxial growth is required to take place, thus minimising the risk of polycrystalline growth such as is found liable to occur on substantial areas of epitaxial growth resistant material such as silicon nitride.

The invention is applicable to the manufacture of a large variety of different structures including, but not limited to, monolithic receivers, detector arrays with waveguides and demultiplexers, laser arrays with couplers, coherent receivers with lasers, waveguides, couplers and detectors with forms of associated electronics devices, but for the purposes of illustrating particular embodiments of the invention, attention will be confined to the manufacture of monolithic structures which include a photodiode together with associated FET devices.

BRIEF DESCRIPTION OF THE DRAWINGS

There follows a description of the manufacture of such monolithic devices in manners embodying the invention in preferred forms. The description refers to the accompanying drawings, in which.

DETAILED DESCRIPTION OF PREFERRED EMBODIMENTS

Figure 1:
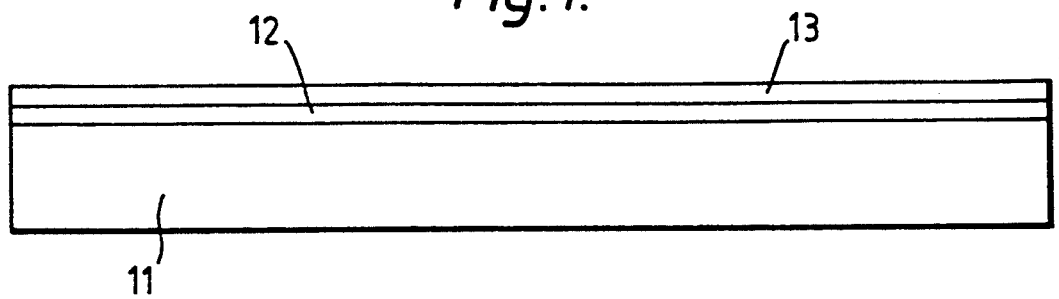
FIGS. 1 to 8 depict successive stages in the manufacture of a PIN-FET integrated device.
Figure 2:
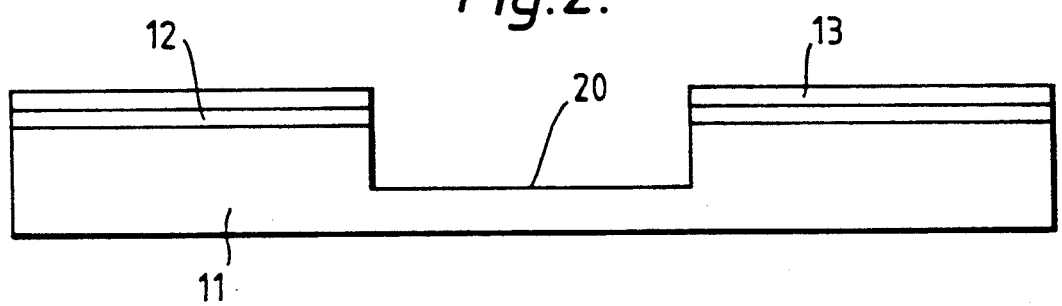
Figure 3:
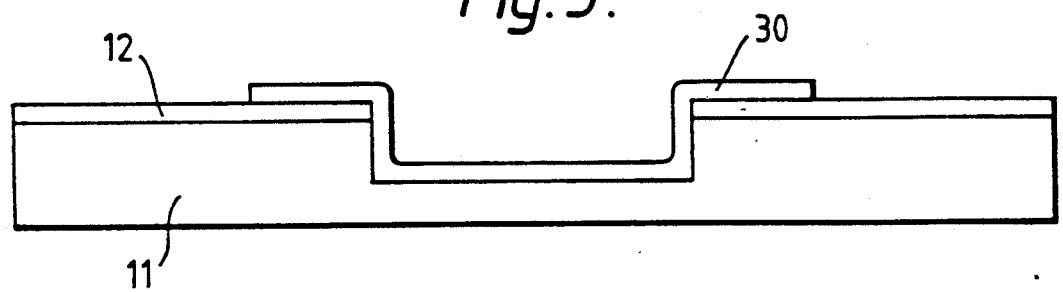

Referring to FIGS. 1 to 8 of the accompanying drawings, one major surface of a substrate 11, typically of indium phosphide, is covered with a layer 12 of an epitaxial growth resistant mask material such as silicon nitride. This mask layer 12 is itself covered with a layer 13 of photolithographic masking material (FIG. 1). The masking material 13 is patterned, and a window is etched through the underlying epitaxial growth resistant mask layer 12 and into the substrate 11 beneath to form a well 20 (FIG. 2). The rest of the photolithographic masking layer 13 is removed before fresh photolithographic masking is applied and developed to leave a masking layer 30 (FIG. 3) masking the well 20 and its immediate surroundings. The regions of the epitaxial growth resistant layer 12 not covered by the masking 30 are then removed by selective etching to leave a window-frame (annular ring) 40 of epitaxial growth resistant material (FIG. 4) surrounding the well. The window-frame needs to be wide enough to enable subsequent masking to be applied to the region enclosed by the window-frame, or to the region outside the confines of the window-frame, without engendering any excessive problems of mask registration. This ensures that either region can be fully masked without risk of encroachment upon the other region. Typically therefore the width of the window-frame is at least 2 um wide, but generally not more than 100 um wide. Following formation of this window-frame 40, the masking 30 is removed.

Figure 5:
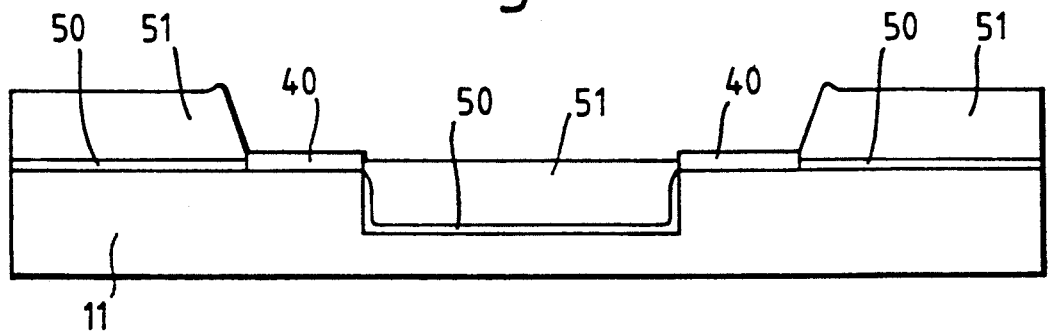
Figure 6:
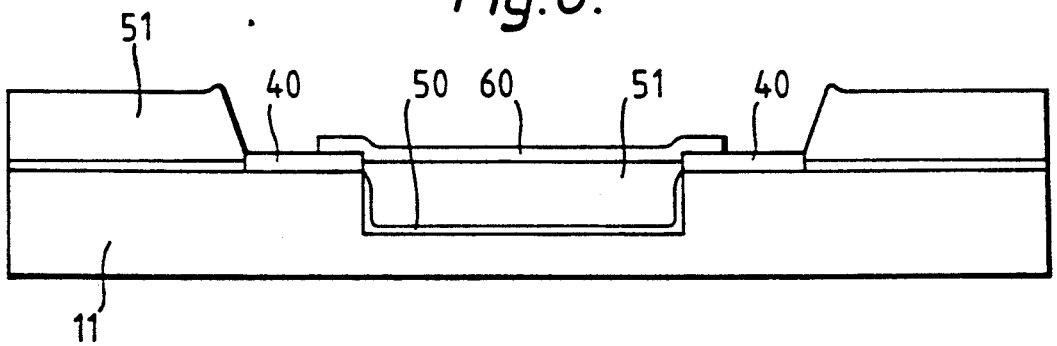

Referring now to FIG. 5, vapour phase epitaxial growth is performed of a first set of layers 50 in which FET structures can subsequently be formed, and this is immediately succeeded by the growth of a set of layers 51 in which a PIN photodiode can subsequently be formed. The layers 50 typically have an aggregate thickness of about 0.5 um while the aggregate thickness of the layers 51 is typically about 3 to 4 um. The depth of the well 20 is made approximately equal to the thickness of the set of layers 51 so that the top of the topmost layer of layers 51 is substantially flush with the top of the topmost layer of layers 50 in the region outside the well.

Figure 7:
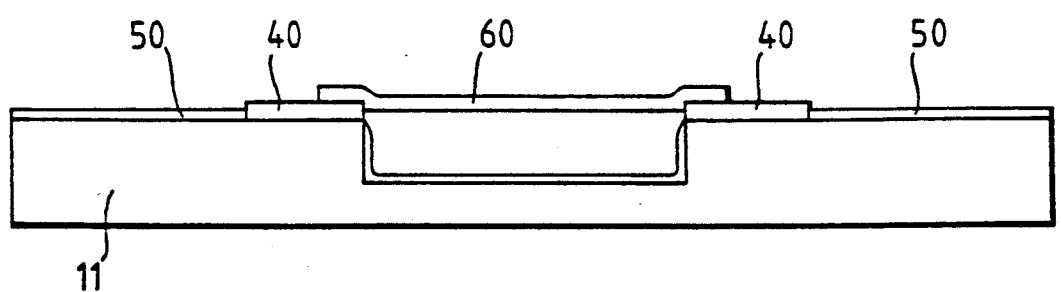

The layers 51 are not required outside the well 20, and so a photolithographic mask 60 (FIG. 6) is developed which covers the growth within the well and overlaps only a part of the full width of the window-frame 40. The unmasked material of the layers 51 is then selectively etched away to leave the structure as depicted in FIG. 7. Then the photolithographic mask 60 and the window frame 40 are removed to leave the structure as depicted in FIG. 8 in which the surface of the device carrying the epitaxially deposited layers is substantially flat and therefore convenient for high definition processing steps employed in FET fabrication.

Figure 4:
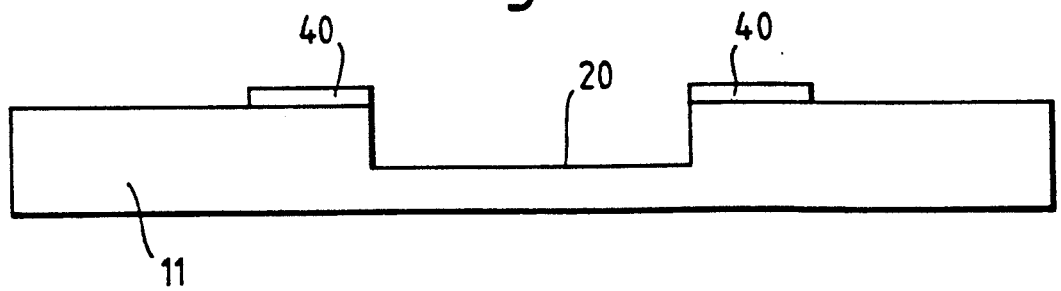
Figure 9:
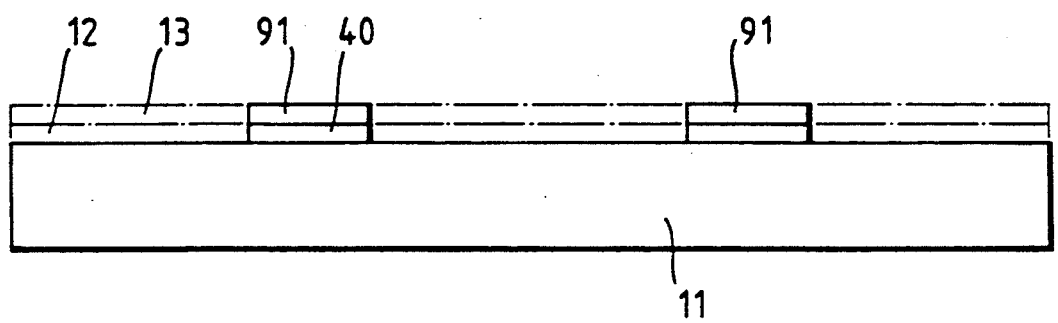
FIGS. 9 to 20 depict stages in alternative methods of manufacture.
Figure 10:
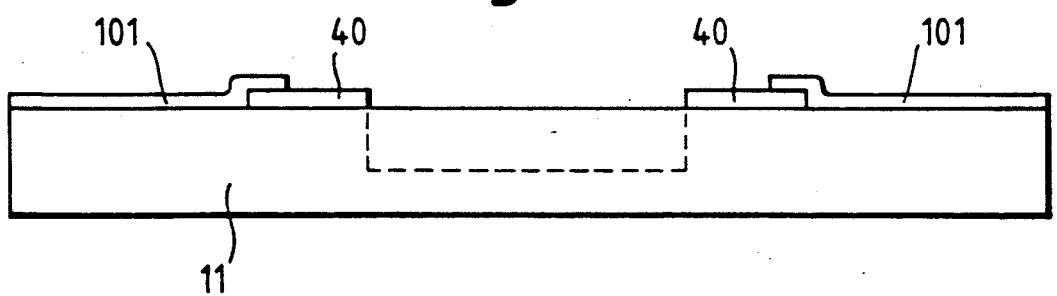

In the foregoing specific description the well 20 was created before the outer edge of the window-frame 40 was delineated, but this order of events may be reversed. Thus the photolithographic masking material layer 13 of FIG. 1 may alternatively be developed to provide a window-frame shaped mask 91, as depicted in FIG. 9. The regions of the epitaxial growth resistant layer 12 not covered by this mask 91 are then removed by selective etching to leave the window-frame mask 40 of epitaxial growth resistant layer 12 material. The photolithographic mask 91 is removed before fresh photolithographic masking is applied and developed to leave a masking layer 101 (FIG. 10) masking the exposed region of the substrate 11 lying outside the confines of the window-frame mask 40. Then the well 20 is etched to leave the structure as depicted in FIG. 4.

Figure 8:
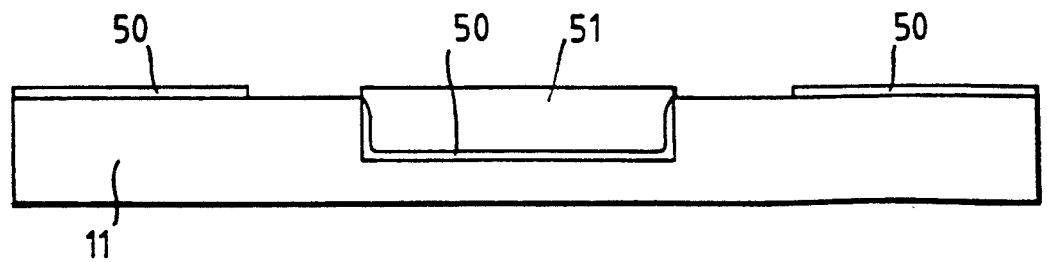
Figure 11:
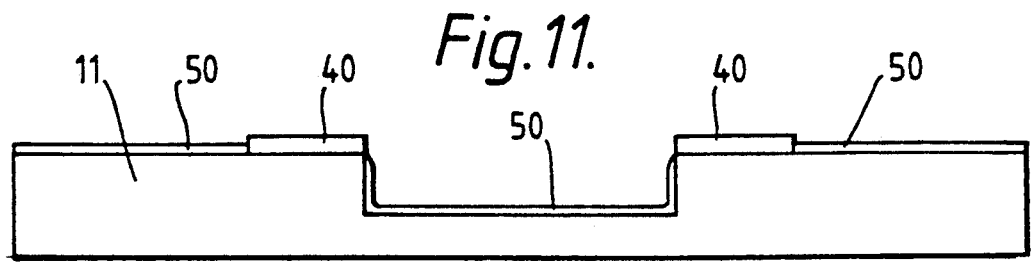
Figure 12:
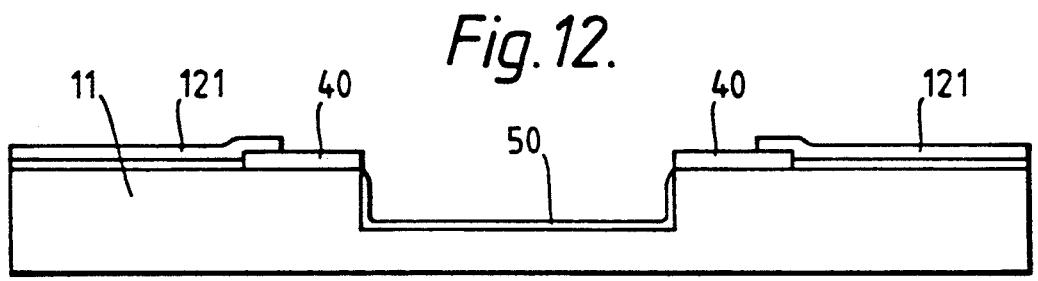
Figure 13:
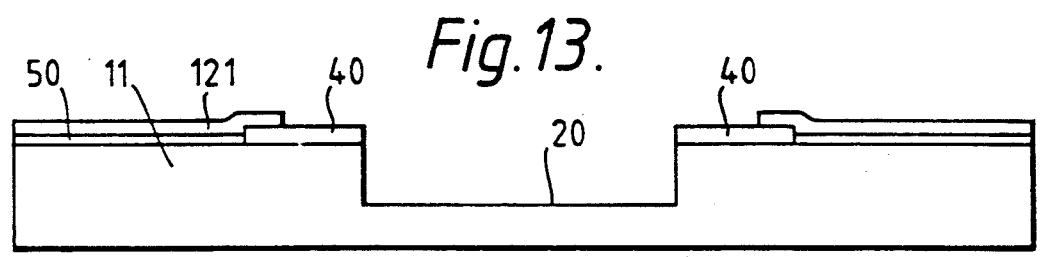
Figure 14:
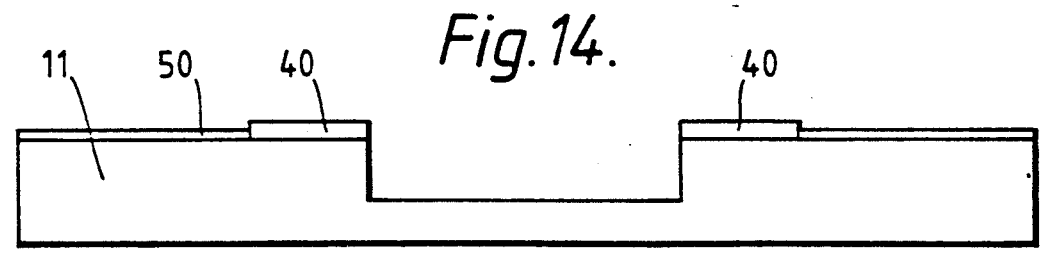
Figure 15:
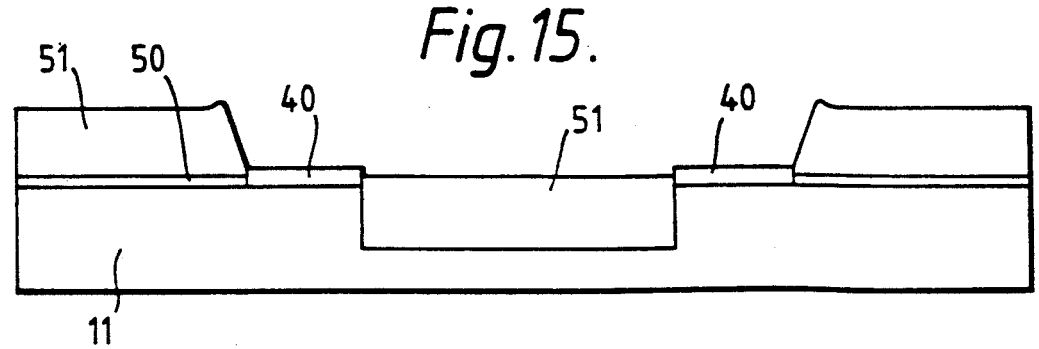

One feature of the device of FIG. 8 which may prove a drawback in certain applications is that the layers 51 have underlying them the layers 50. This can be avoided by performing the epitaxial growth of the two sets of layers 50 and 51 in two stages separated by intervening processing steps. After the stage represented in FIG. 5 has been reached, the first stage of epitaxial growth is performed to deposit the layers 50 as depicted in FIG. 11. Then a photolithographic mask 121 (FIG. 12) is prepared to mask the epitaxial growth that has occurred in the region outside the confines of the window-frame mask 40 before the layers 50 are removed from the area enclosed by the window frame as depicted in FIG. 13. The mask 121 is removed (FIG. 14), and then the second stage of epitaxial growth is performed with the deposit of the layer 51 (FIG. 15). In this instance the depth of the well 20 is approximately equal to the difference between the aggregate thickness of the layers 51 and that of layers 50 so that, as before, the top of the topmost layer of the layers 51 is substantially flush with the top of the topmost layer of layers 50.

Following the growth of the layers 51, those portions outside the well are removed in the same way as previously described above with reference to FIGS. 6, 7 and 8 to leave a structure identical with that depicted in FIG. 8 except for the absence of the layers 50 from the region of the well 20.

Figure 16:
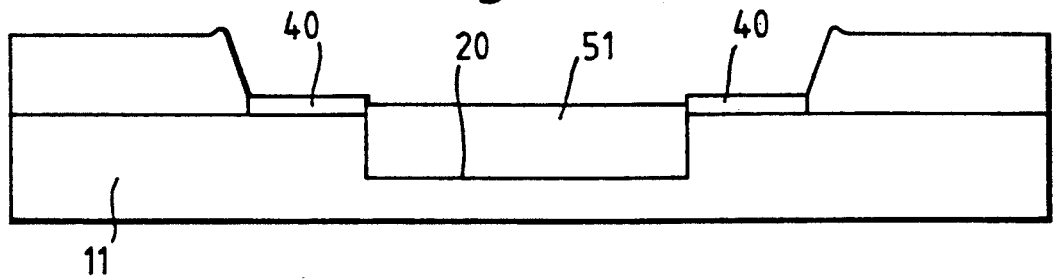
Figure 17:
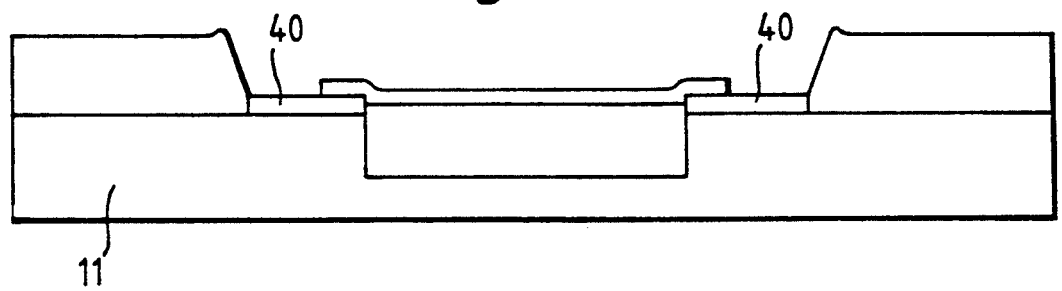
Figure 18:
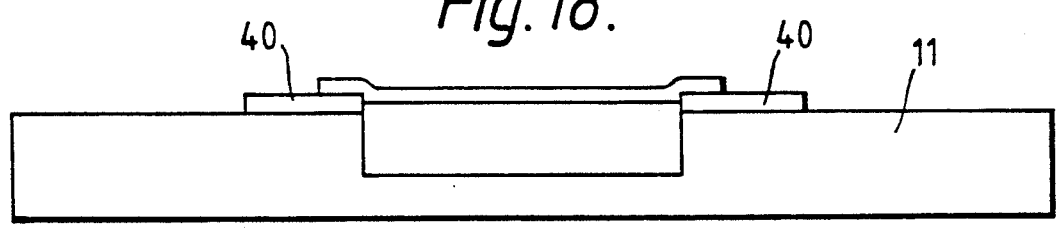
Figure 19:
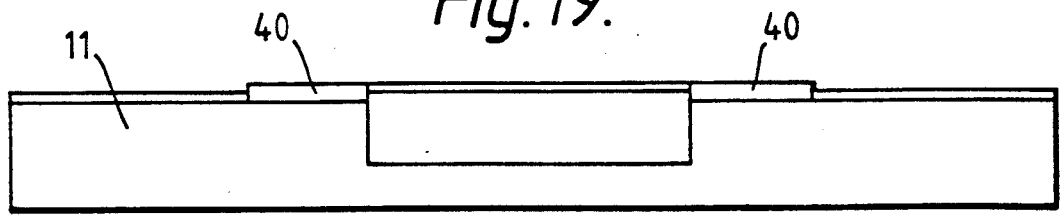
Figure 20:
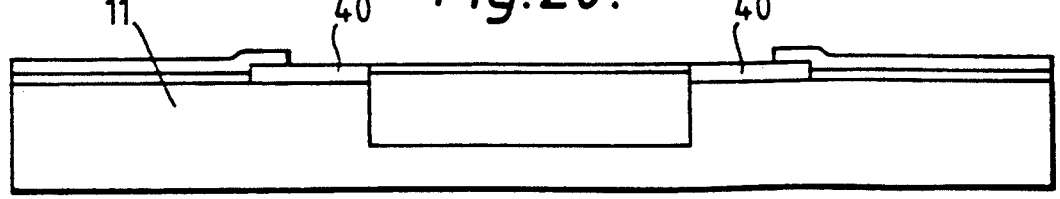

One of the problems liable to be associated with the sequence of processing steps just described with particular reference to FIGS. 11 to 15 results from the fact that the masking 121 is applied subsequent to the etching of the well 20, and before its in-filling has been completed. Problems can be encountered with respect to unwanted residual material remaining upon the side walls of the well. These problems can be avoided by growing the set of layers 51 before the growth of the set of layers 50 instead of after. In this instance, once the well 20 and its surrounding window-frame mask 40 have been prepared, as depicted in FIG. 4, the set of layers 51 is grown to provide a structure as depicted in FIG. 16. Then the masking layer 60 is applied to cover the in-filled well as depicted in FIG. 17. Next the exposed regions of the set of layers 51 are removed to leave the structure as depicted in FIG. 18. This is followed by the growth of the set of layers 50, as depicted in FIG. 19, and then the application of masking 121 (FIG. 20) preparatory for removal of the layers 50 from the area enclosed by the window-frame mask 40. Removal of the masking 121, then leaves a structure distinguished from that illustrated in FIG. 8 only by the absence of any layers 50 underlying the layers 51 in the in-filled well 20.

The structure of FIG. 8, with or without the presence of the layers 50 in its well 20, is then subject to further processing using conventional techniques to form the requisite FET's and photodiode respectively in the layers 50 and 51 to provide the requisite terminal metallisations, interconnects and optionally integrated resistors, capacitors, inductors and diodes (not shown).

While the specific description has related exclusively to the provision of structures in which a well is in-filled with epitaxially grown material to substantially the same level as other epitaxially grown material grown upon the surrounding surface, it should be clearly understood that the invention is applicable also to the manufacture of structures of a complementary format in which epitaxially grown material is grown upon a floor surrounding a mesa to substantially the same level as other epitaxially grown material grown upon the top of the mesa.

Additionally, although the specific description has related particularly to the provision of a monolithic structure including a photodiode and associated FET circuitry, it is to be understood that the invention is applicable also to the provisions of many other forms of complex structure, including in particular to the provision of integrated optics structures such as structures incorporating photodetectors and associated optical waveguides. In such integrated optics structures a detector may for instance be formed in a well located at one end of an optical waveguide terminating at or just short of the well.

We claim:

1. A method of semiconductor device manufacture, which method includes the use of a window-frame shaped epitaxial growth resistant mask having an inner perimeter and an outer perimeter, which mask is located on one surface of a semiconductor body, wherein masking that is used to delineate the side walls of a well formed in said semiconductor body is also used to delineate the inner perimeter of the frame-shaped mask, wherein, using said mask, a layer is epitaxially grown upon the semiconductor body both in the region surrounded by the inner perimeter of the mask and in the region surrounding the outer perimeter, and wherein further masking is provided to cover the epitaxially grown layer in the region surrounded by the inner perimeter of the mask while, in the region surrounding the outer perimeter, at least a portion of the thickness of the layer is removed by etching.

2. A method of semiconductor device manufacture, which method includes the use of a window-frame shaped epitaxial growth resistant mask having an inner perimeter and an outer perimeter, which mask is located on one surface of a semiconductor body, wherein masking that is used to delineate the side walls of a mesa formed in said semiconductor body is also used to delineate the outer perimeter of the frame-shaped mask, wherein, using said mask, a layer is epitaxially grown upon the semiconductor body both in the region surrounded by the inner perimeter of the mask and in the region surrounding the outer perimeter, and wherein further masking is provided to cover the epitaxially grown layer in the region surrounding the outer perimeter of the mask while, in the region surrounded by the inner perimeter, at least a portion of the thickness of the layer is removed by etching.

3. A method of semiconductor device manufacture, which method includes the steps of;
 depositing an epitaxial growth resistant mask layer upon a surface of a semiconductor body, selectively etching a the mask layer to leave a window-frame shaped mask of epitaxial growth resistant material having an inner perimeter and an outer perimeter,
 forming by etching a well in said semiconductor body using the inner perimeter of the frame-shaped mask to delineate the side walls of the well,
 epitaxially growing a layer upon the semiconductor body in the region surrounded by the inner perimeter of the mask and in the region surrounding the outer perimeter, masking the epitaxially grown layer in the region surrounded by the inner perimeter of the mask, and
 etching at least a portion of the thickness of the epitaxially grown layer in the region surrounding the outer perimeter of the mask while leaving intact the epitaxially grown layer in the region surrounded by the inner perimeter.

4. A method of semiconductor device manufacture as claimed in claim 3, wherein said step of epitaxially growing a layer of semiconductor material is a step of growing a composite layer grown in two stages, and wherein, between its two growth stages, that portion of the material grown in the first stage in the region that surrounded by the inner perimeter of the window-frame shaped mask is etched away prior to commencement of the second growth stage.

5. A method of semiconductor device manufacture, which method includes the steps of;
 depositing an epitaxial growth resistant mask layer upon a surface of a semiconductor body, selectively etching a the mask layer to leave a window-frame shaped mask of epitaxial growth resistant material having an inner perimeter and an outer perimeter,
 forming by etching a mesa in said semiconductor body using the outer perimeter of the frame-shaped mask to delineate the side walls of the mesa,
 epitaxially growing a layer upon the semiconductor body in the region surrounded by the inner perimeter of the mask and in the region surrounding the outer perimeter, masking the epitaxially grown layer in the region surrounding the outer perimeter of the mask, and
 etching at least a portion of the thickness of the epitaxially grown layer in the region surrounded by the inner perimeter of the mask while leaving intact the epitaxially grown layer in the region surrounding the outer perimeter.

6. A method of semiconductor device manufacture as claimed in claim 5, wherein said step of epitaxially growing a layer of semiconductor material is a step of growing a composite layer grown in two stages, and wherein, between its two growth stages, that portion of the material grown in the first stage in the region that surrounded by the inner perimeter of the window-frame shaped mask is etched away prior to commencement of the second growth stage.

7. A method of semiconductor device manufacture, which method includes the steps of:
 depositing an epitaxial growth resistant mask layer upon a surface of a semiconductor body, selectively etching through said mask layer and into the underlying semiconductor material to delineate the inner perimeter of a window-frame shaped mask to be created in said mask layer and to form a well in the semiconductor body, selectively etching said mask layer a further time to complete the creation of the frame-shaped mask by the delineation of its outer perimeter while leaving intact its inner perimeter, epitaxially growing a layer upon the semiconductor body in the region surrounded by the inner perimeter of the mask and in the region surrounding the outer perimeter, masking the epitaxially grown layer in the region surrounded by the inner perimeter of the mask, and etching at least a portion of the thickness of the epitaxially grown layer in the region surrounding the outer perimeter of the mask while leaving intact the epitaxially grown layer in the region surrounded by the inner perimeter.

8. A method of semiconductor device manufacture as claimed in claim 7, wherein said step of epitaxially growing a layer of semiconductor material is a step of growing a composite layer grown in two stages, and wherein, between its two growth stages, that portion of the material grown in the first stage in the region that surrounds the outer perimeter of the window-frame shaped mask is etched away prior to commencement of the second growth stage.

9. A method of semiconductor device manufacture, which method includes the steps of:

depositing an epitaxial growth resistant mask layer upon a surface of a semiconductor body, selectively etching through said mask layer and into the underlying semiconductor material to delineate the outer perimeter of a window-frame shaped mask to be created in said mask layer and to form a mesa in the semiconductor body, selectively etching said mask layer a further time to complete the creation of the frame-shaped mask by the delineation of its inner perimeter while leaving intact its outer perimeter, epitaxially growing a layer upon the semiconductor body in the region surrounded by the inner perimeter of the mask and in the region surrounding the outer perimeter, masking the epitaxially grown layer in the region surrounding the outer perimeter of the mask, and etching at least a portion of the thickness of the epitaxially grown layer in the region surrounded by the inner perimeter of the mask while leaving intact the epitaxially grown layer in the region surrounding the outer perimeter.

10. A method of semiconductor device manufacture as claimed in claim 9, wherein said step of epitaxially growing a layer of semiconductor material is a step of growing a composite layer grown in two stages, and wherein, between its two growth stages, that portion of the material grown in the first stage in the region that surrounds the outer perimeter of the window-frame shaped mask is etched away prior to commencement of the second growth stage.

* * * * *